(12) United States Patent
Piper et al.

(10) Patent No.: US 11,073,911 B2
(45) Date of Patent: Jul. 27, 2021

(54) PROVIDING HAPTIC FEEDBACK

(71) Applicant: HEWLETT-PACKARD DEVELOPMENT COMPANY, L.P., Houston, TX (US)

(72) Inventors: Shawn Richard Piper, Vancouver, WA (US); Brian Spate, Houston, TX (US); Michael W. Hu, Vancouver, WA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 524 days.

(21) Appl. No.: 16/079,181

(22) PCT Filed: Oct. 11, 2016

(86) PCT No.: PCT/US2016/056436
§ 371 (c)(1),
(2) Date: Aug. 23, 2018

(87) PCT Pub. No.: WO2018/071000
PCT Pub. Date: Apr. 19, 2018

(65) Prior Publication Data
US 2019/0056788 A1  Feb. 21, 2019

(51) Int. Cl.
*H01L 41/193* (2006.01)
*G06F 3/01* (2006.01)
*H01H 13/85* (2006.01)

(52) U.S. Cl.
CPC ............ *G06F 3/016* (2013.01); *H01H 13/85* (2013.01); *H01L 41/193* (2013.01)

(58) Field of Classification Search
CPC .. G06G 3/016; H01H 13/85; H01H 2003/008; H01H 2215/00; H01L 41/193
See application file for complete search history.

(56) References Cited

U.S. PATENT DOCUMENTS

| 9,965,036 B2 * | 5/2018 | Deokar | G06F 3/016 |
| 10,772,394 B1 * | 9/2020 | Michalske | A44C 5/14 |
| 2010/0141407 A1 | 6/2010 | Heubel et al. | |

(Continued)

FOREIGN PATENT DOCUMENTS

| WO | 2014117125 A1 | 7/2014 |
| WO | 2016069476 A1 | 5/2016 |

OTHER PUBLICATIONS

"Apple Invention Covers Haptic System for Apple Watch, Sports Bands and Biometric Monitors", Retrieved from internet—http://www.patentlyapple.com/patently-apple/2016/01/apple-invention-covers-haptic-system-for-apple-watch-sports-bands-and-biometric-monitors.html, Jan. 28, 2016, 4 Pages.

(Continued)

*Primary Examiner* — J. San Martin
(74) *Attorney, Agent, or Firm* — HP Inc. Patent Department

(57) ABSTRACT

Providing haptic feedback includes a first electrode, a second electrode, an electroactive polymer located between the first electrode and the second electrode such that when a voltage is applied between the electrodes, the electroactive polymer expands creating a force, and a haptic object to apply the force to create the haptic feedback, wherein the haptic object includes a base to receive the force from the electroactive polymer, and a vertex, opposite to and with a smaller surface area than the base, to apply localized haptic feedback to a user.

15 Claims, 9 Drawing Sheets

(56) References Cited

U.S. PATENT DOCUMENTS

| | | | |
|---|---|---|---|
| 2012/0286944 A1* | 11/2012 | Forutanpour | G06F 3/016 340/407.1 |
| 2015/0102947 A1 | 4/2015 | Chung et al. | |
| 2016/0023245 A1 | 1/2016 | Zadesky et al. | |
| 2016/0024332 A1 | 1/2016 | Loick et al. | |
| 2016/0187977 A1 | 6/2016 | Cruz-Hernandez et al. | |
| 2016/0195928 A1 | 7/2016 | Wagner et al. | |
| 2016/0226542 A1 | 8/2016 | Tran et al. | |
| 2019/0312193 A1* | 10/2019 | Pelssers | H01L 41/042 |
| 2019/0384403 A1* | 12/2019 | Khoshkava | H01L 41/0536 |

OTHER PUBLICATIONS

"ViviTouch Haptic Technology Hands-On: Electroactive Polymer Giving a 'High Definition Feel'", Retrieved from internet—https://www.engadget.com/2011/09/17/vivitouch-haptic-technology-hands-on-electroactive-polymer-givi/, Sep. 17, 2011, 7 Pages.

Rossi et al., "Electroactive Polymer Patches for Wearable Haptic Interfaces", Retrieved from internet—https://ieeexplore.ieee.org/document/6092064/, 2011, 4 Pages.

* cited by examiner

PROVIDING HAPTIC FEEDBACK

BACKGROUND

Electronic devices such as smart watches, activity trackers, among other electronic devices are worn by a user. For example, an electronic device includes a band to allow the electronic device to be worn around the user's appendage, such as a wrist, an ankle, or an upper arm. The electronic devices are embedded with electronics to enhance the user's experience while being worn by the user. Embedded electronics include a display to display information to the user, a microphone to receive verbal commands from the user, a speaker to play audible sounds to the user, and sensors to interpret the user's environment. These electronics allow the electronic devices to interact with the user.

BRIEF DESCRIPTION OF THE DRAWINGS

The accompanying drawings illustrate various examples of the principles described herein and are a part of the specification. The examples do not limit the scope of the claims.

Throughout the drawings, identical reference numbers designate similar, but not necessarily identical, elements.

DETAILED DESCRIPTION

Figure 1A:
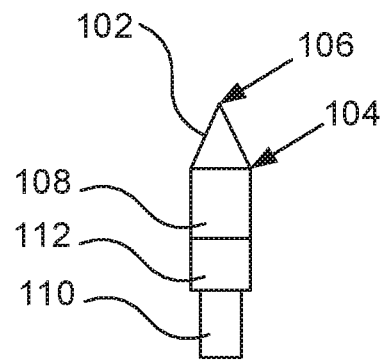
FIG. 1A is a side view of an actuator for providing haptic feedback, according to one example of principles described herein.

As mentioned above, electronic devices are embedded with electronics to enhance a user's experience. In an example, the user's experience is enhanced through haptic feedback provided by the electronic device. Haptic feedback is a type of communication that relies on the sense of touch. As a result, haptic feedback is both nonverbal and nonvisual.

Typically, haptic feedback in electronic devices is used as a response to the user touching the electronic device or is used to solicit an action from the user. Actions include desiring a response from a user to an incoming notification.

The haptic feedback in electronic devices recreates the sense of touch through vibrations of mechanical components such as motor and linear resonant actuators contained within the electronic devices. To create the haptic feedback via mechanical components, an eccentric mass is connected to a shaft of a motor. When the motor receives an electrical signal, the shaft of the motor rotates. Since the eccentric mass is connected to the shaft of the motor, the eccentric mass rotates. This produces a vibration and creates the haptic feedback.

The mechanical components have a high power need and are large in size relative to other component of the electronic device. As a result, the mechanical components are located within the primary case of the electronic device, such as a watch case of a smart watch. The location of the mechanical components within the primary case of the electronic device restricts the efficacy of the haptic feedback. As a result, the electronic device has to be powerful enough to generate haptic feedback through the primary case of the electronic device to be felt by the user.

Since the mechanical components are restricted to the primary case of the electronic device, the source of the haptic feedback is restricted to the primary case of the electronic device. For example, if the mechanical components are located in the primary case of a smart watch, the haptic feedback is limited to the dorsum or top of the wrist where the primary case of the smart watch is worn. The dorsum of the wrist has limited nerves. This leaded to a dulled sense of haptic feedback.

The mechanical components operate in a binary fashion. For example, the mechanical components are either in an on state or an off state. This restricts their use in communicating unique and complex patterns of haptic feedback to the user. As a result, using mechanical components such as a motor connected to an eccentric mass in the primary case of the electronic device limits the complexity of the haptic feedback.

The principles described herein include a device for providing haptic feedback. Such a device includes a first electrode, a second electrode, an electroactive polymer located between the first electrode and the second electrode such that when a voltage is applied between the electrodes, the electroactive polymer expands creating a force, and a haptic object to apply the force to create the haptic feedback, wherein the haptic object includes a base to receive the force from the electroactive polymer, and a vertex, opposite to and with a smaller surface area than the base, to apply localized haptic feedback to a user.

Such a device allows a number of small actuators to be disposed within a band of an electronic device such that haptic feedback is not restricted to the primary case of the electronic device. This allows haptic feedback to be created on all sides of the wrist for an electronic device worn around the user's wrist. As a result, the two main nerves of the wrist, the ulnar nerve and the radial nerve, perceive the haptic feedback.

Based on a signal sent to the electroactive polymers, the haptic objects can raise, lower, or generate vibration with a high degree of localized specificity by rapidly modulating. As a result, the haptic feedback is not binary.

Further, each of the actuators is individually addressable. For example, a processor sends a signal to all actuators on a left side of the band to rapidly vibrate while the processor sends a signal to every other actuator on a right side of the band to slowly vibrate. This allows the haptic feedback to be conveyed in unique patterns.

In the present specification and in the appended claims, the term "actuator" means a mechanism that provides haptic feedback. In an example, the actuator includes a haptic object, a first electrode, a second electrode, and an electroactive polymer. The haptic object transitions from one position to another position to provide the haptic feedback based on the electroactive polymer expanding and contracting.

In the present specification and in the appended claims, the term "overmolded material" means a material that is used to encase the actuators. In an example, the overmolded material is the material that a band of an electronic device is made out of.

In the present specification and in the appended claims, the term "unique pattern" means haptic feedback that is provided by the actuators that is distinguishable from any other unique patter. A unique patter is created by engaging a number of actuators such that a correlation between the unique patter and a desired response from the user is created. For example, a unique pattern such as providing haptic feedback via all actuators on the left side of a band then providing haptic feedback via all actuators on the right side of a band indicates the desired response from the user is to answer an incoming call on the electronic device.

Further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

While the specification gives specific examples of the actuators disposed in a band of an electronic device, the actuators may be disposed in wearable items or items a user's physically touches. For example, the actuators can disposed in clothing, shoes, jewelry, hats, gaming controllers, keyboards, or other items.

Referring now to the figures, FIG. 1A is a side view of an actuator for providing haptic feedback, according to one example of principles described herein. As will be described below, the actuator includes a number of components to provide haptic feedback that is localized. In FIG. 1A, the actuator is not stimulated by a signal. As a result, the electroactive polymer is contracted (i.e. not expanded).

As illustrated, the actuator (100) includes a first electrode (108). The first electrode (108) is a cylindrical flexible strand or rod of metal. The first electrode (108) is capable of bearing a voltage and a current of a signal. As will be described below, a signal is transmitted via a processor (114) to the first electrode (108). This allows the electroactive polymer (112) to expand and contract based on the signal.

The actuator (100) includes a second electrode (110). The second electrode (110) is a cylindrical flexible strand or rod of metal. The second electrode (110) is capable of bearing the voltage and the current of the signal sent to the first electrode (108). As will be described below, a signal is transmitted via a processor (114) to the first electrode (108), through the electroactive polymer (112) and to the second electrode (110). This allows the electroactive polymer (112) to expand and contract based on the signal.

As illustrated, the actuator includes the electroactive polymer (112). The electroactive polymer (112) is located between the first electrode (108) and the second electrode (110). Electroactive polymers are polymers that exhibit a change in size or shape when stimulated by a signal. As will be described below, when a voltage from a signal is applied between the electrodes (108 and 110), the electroactive polymer (112) expands creating a force. More information about the electroactive polymer (112) will be described below.

The actuator (100) includes a haptic object (102). The haptic object (102) is used to apply the force based on the expansion of the electroactive polymer (112) to create the haptic feedback. In an example, the haptic object (102) includes a base (104). The base (104) is used to receive the force from the expansion of the electroactive polymer (112).

The haptic object (102) includes a vertex (106). The vertex (106) is located opposite to and with a smaller surface area than the base (104). Since the surface are of the vertex (106) is small, the vertex (106) can apply localized haptic feedback to a user. As will be described below, when the electroactive polymer (112) does not receive the signal, the electroactive polymer (112) is contracted. As a result, the vertex (106) does not touch the user's appendage. Thus, the haptic feedback is not provided. However, when the electroactive polymer (112) receives the signal, the electroactive polymer (112) expands based on the signal. As a result, the vertex (106) touches the user's appendage. Thus, the haptic feedback is provided.

Figure 1B:
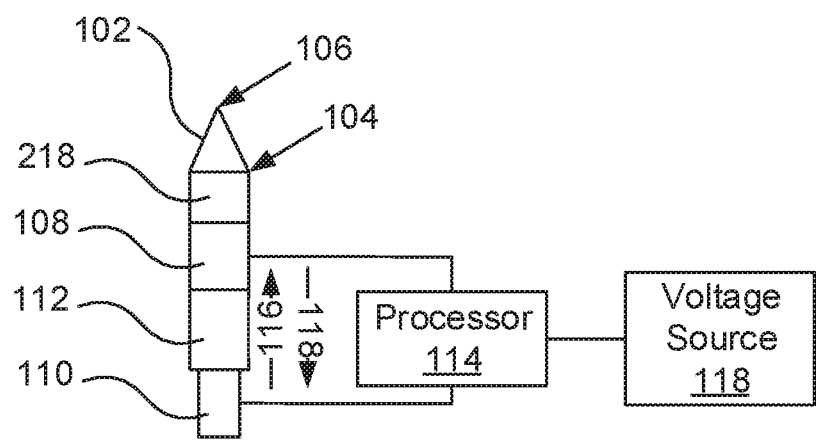
FIG. 1B is a side view of an actuator for providing haptic feedback, according to one example of principles described herein.

FIG. 1B is a side view of an actuator for providing haptic feedback, according to one example of principles described herein. Specifically, FIG. 1B includes additional components not described in FIG. 1A that are used to provide the haptic feedback. In FIG. 1B, the actuator is stimulated by a signal. As a result, the electroactive polymer expands based on the signal.

As illustrated, the diagram includes a voltage source (118). The voltage source (118) is for example, a device that includes at least one electrochemical cell with external connections to provide power to a processor (114) and/or the actuator (100). In an example, the voltage source (118) provides between 0.5 volts (V) and 5V to the processor (114) and/or the actuator (100).

The diagram includes the processor (114). The processor (114) receives a voltage from the voltage source (118). In some examples, the processor (114) determines which actuators (100) receive the voltage of the voltage source (118). In other examples, the processor (114) uses the voltage from the voltage source (118) to create a signal and then determines which actuators (100) receive that signal. The voltage of the voltage source (118) that is received by the processor (114) is sufficient to power the processor (114) and create the signal such that the electroactive polymer (112) can expand.

As illustrated, the processor (114) is connected to the first electrode (108) and the second electrode (110) such that the signal can be sent to the actuator (100). This allows the electroactive polymer (112) to expand and contract based on that signal. As will be described below, the processor (114) determines a signal to send to at least one actuator based on a response the electronic device desires to solicit to the user.

As mentioned above, the actuator (100) includes the electroactive polymer (112). The electroactive polymer (112) is located between the first electrode (108) and the second electrode (110) such that when a voltage of a signal is applied between the electrodes (108 and 110), the electroactive polymer (112) expands creating a force. For example, when the electroactive polymer (112) receives a signal via the processor (114) connected to the voltage source (118), the electroactive polymer (112) is stimulated such that the electroactive polymer (112) expands as indicated by arrow 116. This provides a force on the base (104) of the haptic object (102) such that the vertex (106) of the haptic object (102) contacts the user's appendage to create the haptic feedback.

However, when the electroactive polymer (112) does not receive a signal via the processor (114) connected to the voltage source (118), the electroactive polymer (112) is not stimulated. As a result, the electroactive polymer (112) contracts (if already expanded) as indicated by arrow 118. This alleviates the force on the base (104) of the haptic object (102) such that the vertex (106) of the haptic object (102) does not contact the user's appendage. As a result, the haptic feedback is no longer provided.

For the electroactive polymer (112) to expand, the signal created by the processor (114) is to be sufficient. In an example, the processor (114) is to apply a signal that includes a voltage between 0.5 V and 5 V to the actuator (100). If the processor (114) applies a signal that is less than 0.5 V, the voltage is not sufficient to stimulate the electroactive polymer (112). As a result, the electroactive polymer (112) will not expand and thus the actuator (100) will not provide haptic feedback.

If the processor (114) applies a signal that is more than 5 V, the voltage may over expand the electroactive polymer (112). As a result, the electroactive polymer (112) can become damage. Thus the lifespan of the electroactive polymer (112) will be shortened.

In some examples, the electroactive polymer (112) is selected based on the properties of the electroactive polymer (112). The properties include electrical properties, lifecycle properties, expansion properties, other properties, or combinations thereof.

In an example, the electroactive polymer (112) is an ionic electroactive polymer. An ionic electroactive polymer includes a conducting polymer. The conducting polymer needs 0.5 V to fully expand. As a result, the conducting polymer is desirable since the electrical properties are such that a low voltage is needed to fully expand the electroactive polymer (112). This allows the electronic device to consume less power.

Another type of ionic electroactive polymer is an ionic polymer metal composite (IPMC). IPMC include a thin ionomeric membrane with noble metal electrodes plated on its surface. The IPMC in an actuator is desirable because of their high expansion at such a low voltage and show low impedance. For example, an IMPC needs between 1 V to 5 V to fully expand given a typical size of 10 millimeter (mm) by 40 mm by 0.2 mm.

In another example, the electroactive polymer (112) is field activated. Field activated electroactive polymers are desirable because they generate a larger force than the ionic electroactive polymer. This allows a greater haptic feedback sensation to be created.

In an example, an electroactive polymer (112) that is field activated is a dielectric elastomer. The dielectric elastomer is a material in which actuation is caused by electrostatic forces between two electrodes which squeeze the polymer. The dielectric elastomer is capable of very high forces and is fundamentally a capacitor that changes its capacitance when a voltage is applied by allowing the polymer to compress in thickness and expand in area due to the electric field. Such a dielectric elastomer needs a large amount of voltage to expand. However, the dielectric elastomer does not need to be constantly simulated by a voltage to keep the actuator (100) at a given position. As a result, the dielectric elastomer is desirable for haptic feedback where the forces generated by the electroactive polymer (112) needs to be substantial and the actuator (100) often remains in a given position.

Another type of electroactive polymer (112) that is field activated is a ferroelectric polymer. Ferroelectric polymers are a group of crystalline polar polymers that are also ferroelectric, meaning that they maintain a permanent electric polarization that can be reversed, or switched, in an external electric field.

Another type of electroactive polymer (112) that is field activated is polyvinylidene difluoride (PVDF). PVDF is a highly non-reactive thermoplastic fluoropolymer produced by the polymerization of vinylidene difluoride.

Figure 2A:
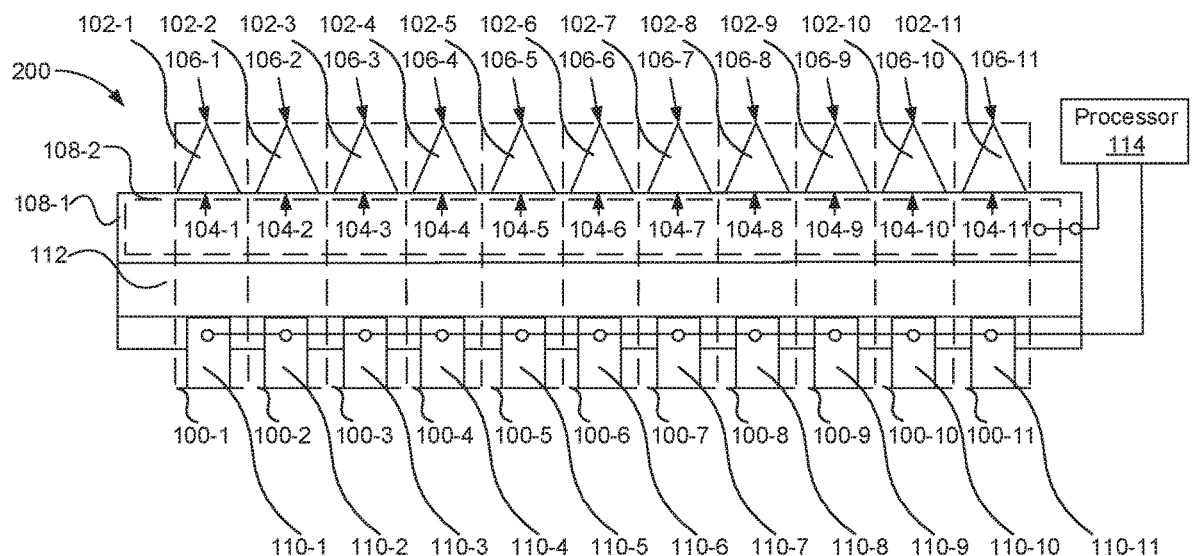
FIG. 2A is a cutaway side view of a number of actuators disposed in a band of an electronic device, according to one example of principles described herein.

FIG. 2A is a cutaway side view of a number of actuators disposed in a band of an electronic device, according to one example of principles described herein. As will be described in FIG. 2A, each of the actuators (100) is independently controlled by a processor (114).

As illustrated, the diagram includes a number of actuators (100) disposed in a band (200) of an electronic device (400). For example, the band (200) includes actuator A (100-1), actuator B (100-2), actuator C (100-3), actuator D (100-4), actuator E (100-5), actuator F (100-6), actuator G (100-7), actuator H (100-8), actuator I (100-9), actuator J (100-10), and actuator K (100-11). As will be described below, each of the actuators (100) is individually addressable and independently controlled by a processor (114) such that unique patterns of haptic feedback can be created. For purposes of explanation, the number of actuators (100) illustrated in this figure, as well as FIGS. 2B and 2C, correspond to the intersections of first electrode A (108-1) and a number of second electrodes (110). It should be understood that more actuators are disposed within the band (200) at the intersections of a number of first electrodes (108) and the number of second electrodes (110).

The band (200) includes the number of first electrodes (108). In this example, the band (200) includes first electrode A (108-1) and first electrode B (108-2). First electrode A (108-1) is located in front of first electrode B (108-2) as indicated by the dashed lines. Although first electrode A (108-1) and first electrode B (108-2) are the only first electrodes (108) illustrated in in this figure, as well as FIGS. 2B and 2C, other first electrodes are also disposed within the band (200). As will be described in FIG. 3, the first electrodes (108) are placed perpendicular to a number of corresponding second electrodes (110). This allows each pair of a first electrode (108) and a second electrode (110) to be individually addressable. As a result, any actuators (100) can be used to provide the haptic feedback.

The actuators (100) further include an electroactive polymer (112) located between the first electrodes (108) and the second electrodes (110) such that when a signal is transmitted to a pair of a first electrode (108) and a second electrode (110), the electroactive polymer (112) expands at an intersection of that first electrode (108) and that second electrode (110) creating a force.

As illustrated, the diagram includes a number of haptic objects (102). The haptic objects (102) are located at each intersection of first electrode A (108-1) and a second electrode (110). For example, haptic object A (102-1) is located at the intersection of first electrode A (108-1) and second electrode A (110-1). As a result, haptic object A (102-1) corresponds to actuator A (100-1). Haptic object B (102-2) is located at the intersection of first electrode A (108-1) and second electrode B (110-2). As a result, haptic object B (102-2) corresponds to actuator B (100-2). Haptic object C (102-3) is located at the intersection of first electrode A (108-1) and second electrode C (110-3). As a result, haptic object C (102-3) corresponds to actuator C (100-3). Haptic object D (102-4) is located at the intersection of first electrode A (108-1) and second electrode D (110-4). As a result, haptic object D (102-4) corresponds to actuator D (100-4). Haptic object E (102-5) is located at the intersection of first electrode A (108-1) and second electrode E (110-5). As a result, haptic object E (102-5) corresponds to actuator E (100-5). Haptic object F (102-6) is located at the intersection of first electrode A (108-1) and second electrode F (110-6). As a result, haptic object F (102-6) corresponds to actuator F (100-6). Haptic object G (102-7) is located at the intersection of first electrode A (108-1) and second electrode G (110-7). As a result, haptic object G (102-7) corresponds to actuator G (100-7). Haptic object H (102-7) is located at the intersection of first electrode A (108-1) and second electrode H (110-7). As a result, haptic object H (102-7) corresponds to actuator H (100-7). Haptic object I (102-8) is located at the intersection of first electrode A (108-1) and second electrode I (110-8). As a result, haptic object I (102-8) corresponds to actuator I (100-8). Haptic object J (102-10) is located at the intersection of first electrode A (108-1) and second electrode J (110-10). As a result, haptic object J (102-10) corresponds to actuator J (100-10). Haptic object K (102-11) is located at the intersection of first electrode A (108-1) and second electrode K (110-11). As a result, haptic object K (102-11) corresponds to actuator K (100-11). While the haptic objects (102) illustrated in this figure, as well as FIGS. 2B and 2C, correspond to the intersections of first electrode A (108-1) and a number of second electrodes (110), it should be understood that more haptic objects are disposed within the band (200) at the intersections of first electrodes B (108-2) and the number of second electrodes (110). Further, if the band (200) includes more first electrodes (108), more haptic objects are disposed within the band (200) at the intersections of those first electrodes and the number of second electrodes (110) as well.

Each of the haptic objects (102) includes a base (104) to receive the force generated by the expansion of the electroactive polymer (112). Each of the haptic objects (102) includes a vertex (106), opposite to and with a smaller surface area than the base (104), to apply localized pressure to a user wearing the electronic device. For example, haptic object A (102-1) includes base A (104-1) and vertex A (106-1). Haptic object B (102-2) includes base B (104-2) and vertex B (106-2). Haptic object C (102-3) includes base C (104-3) and vertex C (106-3). Haptic object D (102-4) includes base D (104-4) and vertex D (106-4). Haptic object E (102-5) includes base E (104-5) and vertex E (106-5). Haptic object F (102-6) includes base F (104-6) and vertex F (106-6). Haptic object G (102-7) includes base G (104-7) and vertex G (106-7). Haptic object H (102-8) includes base H (104-8) and vertex H (106-8). Haptic object I (102-9) includes base I (104-9) and vertex I (106-9). Haptic object J (102-10) includes base J (104-10) and vertex J (106-10). Haptic object K (102-11) includes base K (104-11) and vertex K (106-11).

The haptic objects (102) are made of a plastic. The plastic is such that the haptic object (102) does not deform when force is applied to the haptic object (102) via the expansion of the electroactive polymer (112).

As mentioned above, a processor (114) is connected to each of the first electrodes (108) and each of the second electrodes (110). As will be described in FIG. 2C, the processor (114) is used to independently control each of the actuators (100) such that unique patterns of the haptic feedback are created within the band (200) of the electronic device.

Figure 2B:
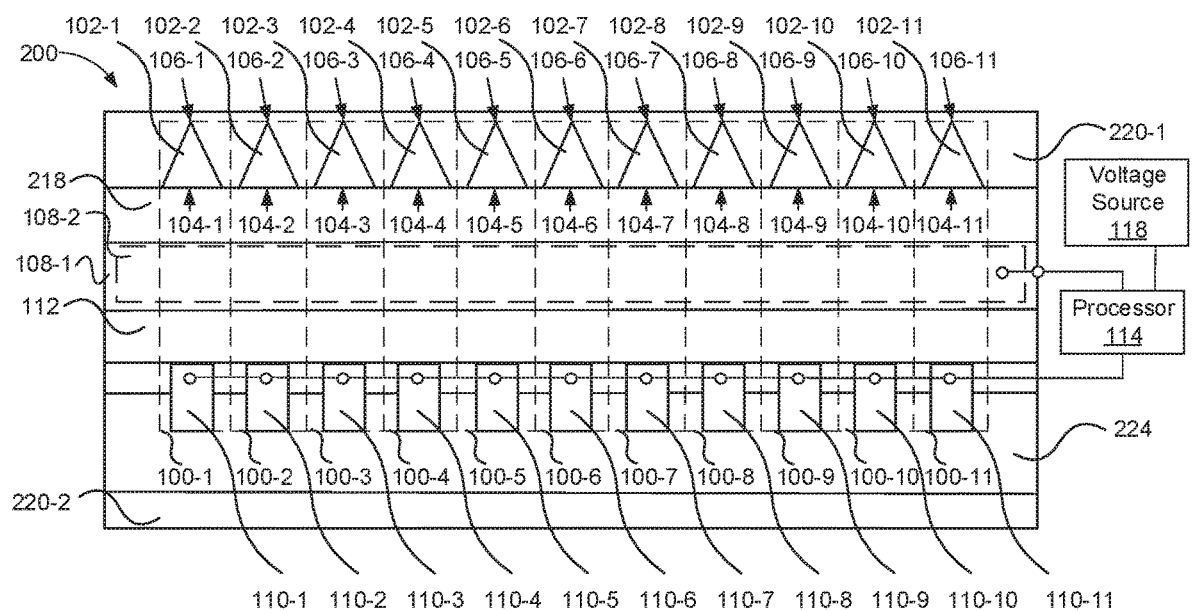
FIG. 2B is a cutaway side view of a number of actuators disposed in a band of an electronic device, according to one example of principles described herein.

FIG. 2B is a cutaway side view of a number of actuators disposed in a band of an electronic device, according to one example of principles described herein. As will be described below, the actuators are encased in an overmolded material.

As illustrated, the band (200) includes an overmolded material (220). The overmolded material (220) is used to encase the number of actuators (100). In an example, the overmolded material (220) is made of an elastomer, silicon, or other flexible materials.

The overmolded material (220) includes a material that has a predefined level of durometer or stiffness. Durometer is one of several measures of the hardness of a material and may be defined as a material's resistance to permanent indentation and/or wear and tear. By selecting the proper material durometer for the overmolded material (220), the haptic feedback as well as the wear and tear of the band (200) may be optimized. For example, a relatively low durometer (i.e., soft) material may best function as to increase the sensitivity of the haptic feedback. However, a relatively high durometer (i.e., hard) material may best function as to increase the durability of the band (100). As a result, the overmolded material (220-1), corresponding to the interior of the band (200), has a lower durometer than the overmolded material (220-2) corresponding to the exterior of the band (200). This allows for more precise localized haptic feedback while maintaining durability.

The overmolded material (220-1), corresponding to the interior of the band (200), includes slots to accommodate the haptic objects (102). As a result, the vertex (106) of the haptic objects (102) are separated from the user's skin by a thin portion of the overmolded material (220-1), corresponding to the interior of the band (200). This allows for more precise localized haptic feedback.

As illustrated, the band (200) includes a flexible film (218). The flexible film (218) is located between the haptic objects (102) and the first electrode (108). In an example, the flexible film (218) provides a support for the haptic objects (102). As a result, during construction of the band (200), the haptic objects (102) are placed in the slots of the overmolded material (220-1), corresponding to the interior of the band (200). The flexible film (218) is then placed on the overmolded material (220-1) corresponding to the interior of the band (200). As a result, the haptic objects (102) are retained within the slots of the overmolded material (220-1) corresponding to the interior of the band (200).

While FIG. 2B illustrates the actuators (100) being designed in a specific manner, the actuators (100) could be designed in various configurations. These configurations include a film that is rolled around a pre-strained spring, a bimorph configuration, a multi-layered array, or a pre-strained diaphragm with a series of spring-backed elements.

Figure 2C:
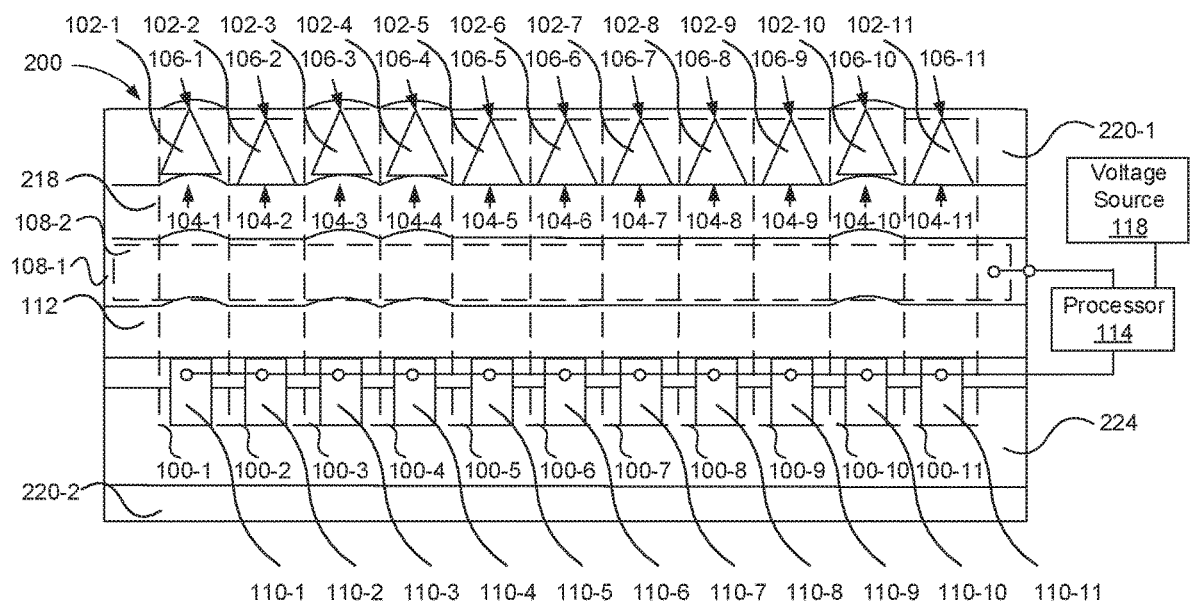
FIG. 2C is a cutaway side view of a number of actuators disposed in a band of an electronic device, according to one example of principles described herein.

FIG. 2C is a cutaway side view of a number of actuators disposed in a band of an electronic device, according to one example of principles described herein. As will be described, individual actuators (100) are activated based on a signal received from a processor (114).

A voltage source (118) is connected to a processor (114) as described above. The processor (114) is connected to each of the first electrodes (108) and each of the second electrodes (110). This allows each pair of a first electrode and a second electrode to be individually addressable. As a result, when a signal is transmitted to a pair of a first electrode and a second electrode, the electroactive polymer (112) expands at an intersection of that first electrode and that second electrode creating a force.

As illustrated, the signal is transmitted to first electrode A (108-1) and second electrode A (110-1), second electrode C (110-3), second electrode D (110-4), and second electrode J (110-10). This results in the electroactive polymer (112) expanding at these intersections. As a result, actuator A (100-1), actuator C (100-3), actuator D (100-4), and actuator J (100-10) are stimulated by the signal such that actuator A (100-1), actuator C (100-3), actuator D (100-4), and actuator J (100-10) provide haptic feedback.

As will be described in FIG. 5, the signal determines which of the actuators (100) are activated, how long each of the actuators (100) are activated, and how much the electroactive polymer (112) expands for each of the actuators (100) that are activated. As a result, unique patterns of haptic feedback are created.

The first electrodes (108), the flexible film (218) and the overmolded material (220-1) corresponding to the interior of the band (200) are flexible such that, when the electroactive polymer (112) expands, the first electrodes (108), the flexible film (218) and the overmolded material (220-1) corresponding to the interior of the band (200) flex. This allows the force generated by the expansion of the electroactive polymer (112) to push on the bases (104) of the haptic objects (102).

While FIG. 2C describes actuator A (100-1), actuator C (100-3), actuator D (100-4), and the actuator K (100-10) being activated by the signal to create a unique pattern, other actuators (100) can be activated by a signal to create other unique patterns. For example, actuator A (100-1) and actuator D (100-4) can be activated by a signal to create other unique pattern.

Figure 3:
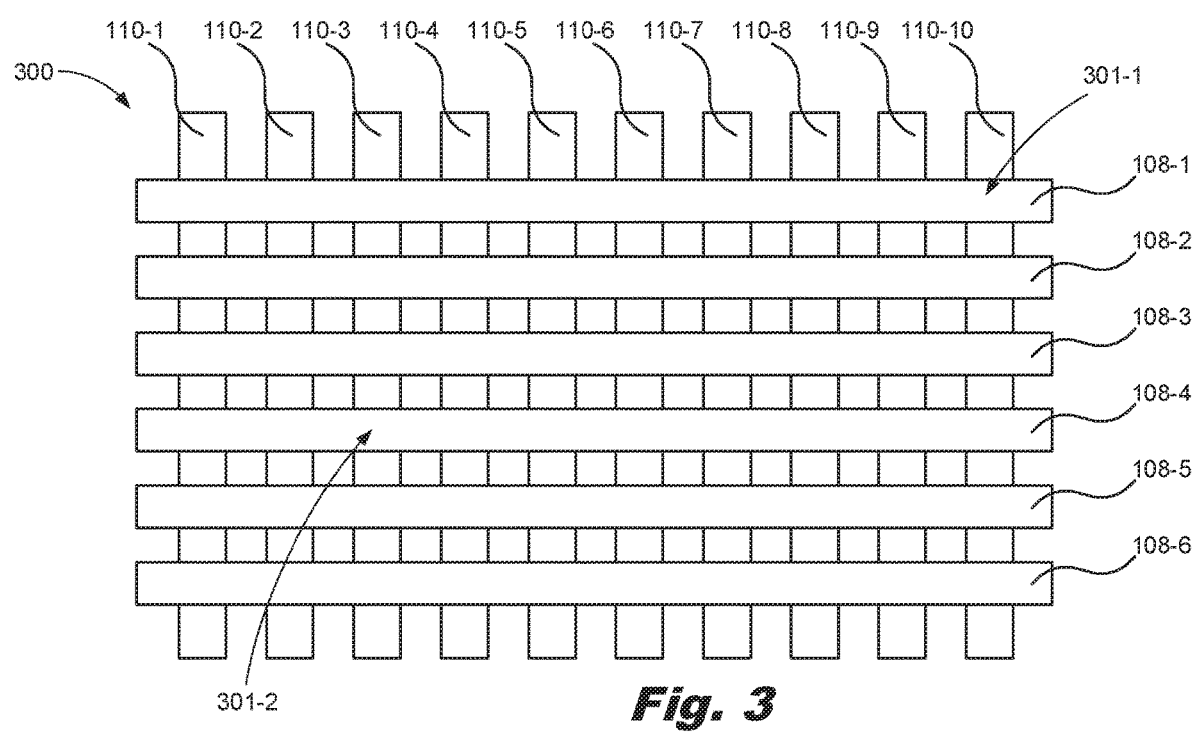
FIG. 3 is a diagram of a number of electrodes arrange as a grid, according to one example of principles described herein.

FIG. 3 is a diagram of a number of electrodes arrange as a grid, according to one example of principles described herein. As will be described below, the actuators are arranged, such that individual actuators can be addressable.

As illustrated, the system (300) includes a number of first electrodes (108). For example, the system (300) includes first electrode A (108-1), first electrode B (108-2), first electrode C (108-3), first electrode D (108-4), first electrode E (108-5), and first electrode F (108-5). Each of the first electrodes (108) is placed parallel to each other.

As illustrated, the system (300) includes a number of second electrodes (110). For example, the system (300) includes second electrode A (110-1), second electrode B (110-2), second electrode C (110-3), second electrode D (110-4), second electrode E (110-5), second electrode F (110-5), second electrode G (110-6), second electrode H (110-7), second electrode I (110-8), second electrode J (110-9), second electrode K (110-10). Each of the second electrodes (110) is placed parallel to each other.

Further, the second electrodes (110) are placed perpendicular to the first electrodes (108). Although the actuators are not illustrated in FIG. 3, an actuator is located at each intersection of the first electrodes (108) and the second electrodes (110). As a result, the actuators are configured in an array form.

To activate an actuator, a first electrode corresponding to a location of the actuator and a second electrode corresponding to an intersection of that location of that actuator is stimulated by a signal. For example, to simulate an actuator located at intersection A (301-1), second electrode K (110-10) and first electrode A (108-1) are stimulated by a signal created by the processor (114). To simulate an actuator located at intersection B (301-2), second electrode C (110-3) and first electrode D (108-4) are stimulated by a signal created by the processor (114). This allows the actuators (100) to be individually addressable such that unique patterns of haptic feedback are created.

This array of actuators (100) would function similar to a light emitting diode (LED) matrix array, which is controlled by series of output lines arranged in rows and columns. The same arrangement is constructed with the actuators (100). Because LED matrix arrays are commonly used, there are commercially available LED Driver integrated circuits (IC) to control the LED matrix in hardware. In one example, a control ICs could be designed and manufactured to perform similar function as the LED Driver IC in controlling the output lines to control the actuators (100). In another embodiment, the logic is controlled by a microcontroller unit (MCU) where each row or column line associated with the electrodes (108 and 110) is controlled by a general purpose input/output (GPIO) pin from the MCU or through a GPIO multiplexer for larger actuator arrays.

To control the actuators (100) in the case of a custom Driver IC, the haptic pattern is treated similarly to an animation in a LED matrix. The haptic pattern is drawn as a frame by frame animation within the driver IC display buffer, which then takes each frame and controls the row and column lines corresponding to the first electrodes (108) and the second electrodes (110) appropriately to activate the actuators (100) according to the unique pattern.

In the case of MCU control, firmware running on the MCU is responsible for controlling individual row and column lines corresponding to the first electrodes (108) and the second electrodes (110) via GPIO pins, driving the lines high and low appropriately to create the haptic pattern. Similar to a LED matrix, the actuators (100) utilize either row scanning or column scanning to reduce the complexity and quantity of outputs from the Driver IC or MCU. The specific scan rate of the actuators (100) is calibrated so each actuator can be fully expressed.

While an example, of an LED matrix is described above, difference between LEDs and these actuators activated via the electroactive polymer is that LEDs need constant voltage to stay on while actuators (100) the toggling of the voltage is used to create the actuation action needed for haptic feedback.

While this example, has been described with reference to the first electrodes (108) and the second electrodes (110) arranged as a grid, the first electrodes (108) and the second electrodes (110) can be arranged in any pattern as long as the actuators (100) can be individually addressed. For example, the first electrodes (108) and the second electrodes (110) can be arranged in a circular pattern, a triangular patter, or other patterns.

Figure 4:
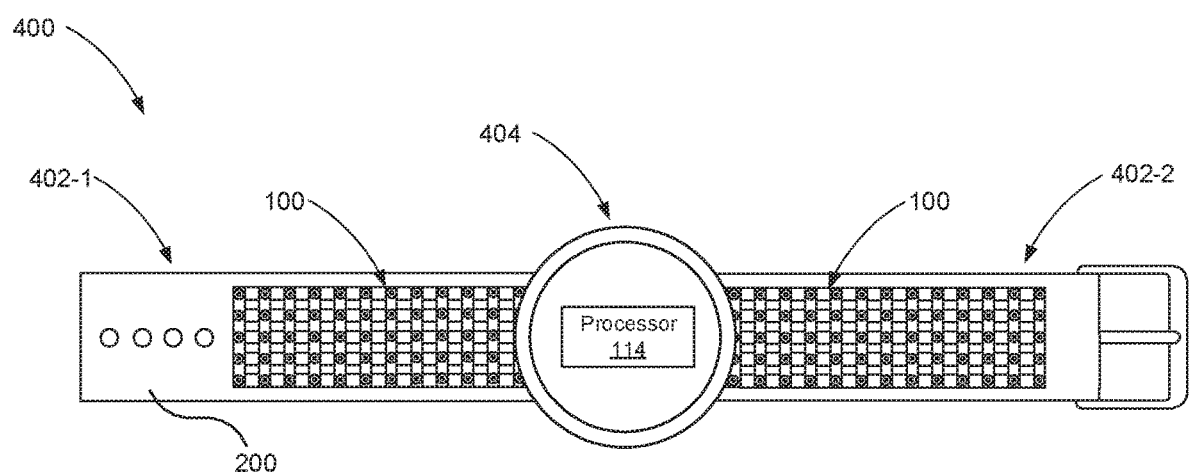
FIG. 4 is a diagram of an electronic device for providing haptic feedback, according to one example of principles described herein.

FIG. 4 is a diagram of an electronic device for providing haptic feedback, according to one example of principles described herein. As will be described below, the actuators (100) are located in a band (402) of an electronic device (400).

As illustrated, the electronic device (400) includes a primary case (404). The primary case (404) houses electronic components such as a display to display information to the user, a microphone to receive verbal commands from the user, a speaker to play audible sounds to the user, sensors to interpret the user's environment, and a processor (114).

As illustrated, the electronic device (400) includes a band (402). The band (402) includes a first side (402-1) and a second side (402-2). As illustrated, the electronic device (400) includes a number of actuators (100) located on a first side (402-1). Each of the actuators (100) in the first side (402-1) of the band is individually addressable as described above. The electronic device (400) includes a number of actuators located on a second side (402-2). Each of the actuators (100) in the second side (402-1) of the band is individually addressable as described above. As a result the processor (114) can output a signal intended for any of these actuators such that unique patterns of haptic feedback are created.

FIG. 5 describe different types of signal. The different types of signals are based on the waveforms of the signal. The waveforms include sinusoidal waveforms, square waveforms, custom waveforms, other waveforms, or combinations thereof. In some examples, a signal is transmitted to all of the actuators (100), one actuator, or actuators associated with a side (402) of a band (200). In some examples, more than one signal is transmitted to one actuator or actuators associated with a side (402) of a band (200). This allows unique patterns of haptic feedback to be created.

Figure 5A:
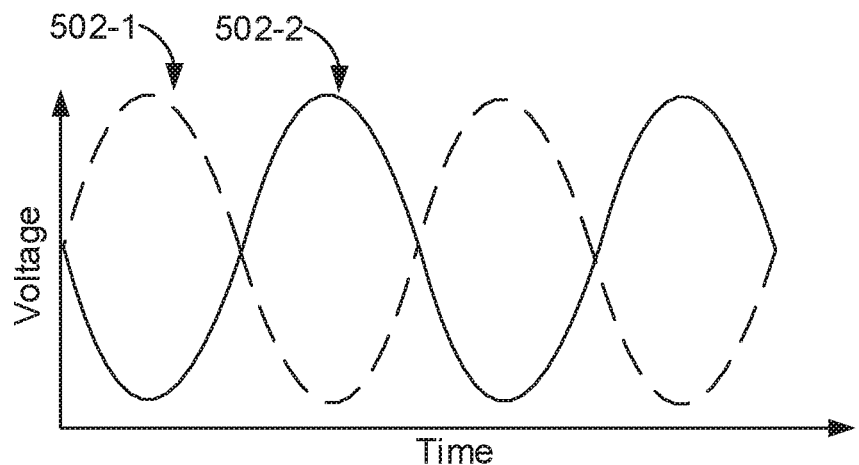
FIG. 5A is a diagram of a signal, according to one example of principles described herein.

FIG. 5A is a diagram of a signal, according to one example of principles described herein. As will be described below, a first signal is used to activate actuators located on a first side (402-1) of a band (200). A second signal is used to activate actuators located on a second side (402-2) of a band (200).

As illustrated, the diagram includes a first signal (502-1) and a second signal (502-2). As illustrated the signals (502) are sinusoidal. As a result, the haptic feedback is slowly applied via the haptic object (102) of the actuator (100) because the electroactive polymer (112) slowly expands and contracts based on these signals (502). For example, at the high peaks of the signals (502), the electroactive polymer is fully expanded. As a result, the vertex (106) of the haptic object (102) engages with the users appendage and provides haptic feedback. However, at the low peaks of the signals (502), the electroactive polymer is fully contracted. As a result, the vertex (106) of the haptic object (102) does not engage with the user's appendage and does provide haptic feedback.

The first signal (502-1) is used to activate actuators (100) located on a first side (402-1) of a band (200). The second signal (502-2) is used to activate actuators (100) located on a second side (402-2) of a band (200). Since the first signal (502-1) and the second signal (502-2) are 180 degrees out of phase with each other, the vertexes (106) of the haptic objects (102) associated with the actuators slowly engage with the user's appendage and provides haptic feedback on the first side (402-1) of the band (200) while the vertexes (106) of the haptic objects (102) associated with the actuators (100) slowly disengage with the user's appendage and don't provide haptic feedback on the second side (402-2) of the band (200).

As a result, a unique pattern is created via the signal (502). In this example, the unique pattern is to solicit a response from the user. The response includes desiring the user to respond to an incoming message.

Figure 5B:
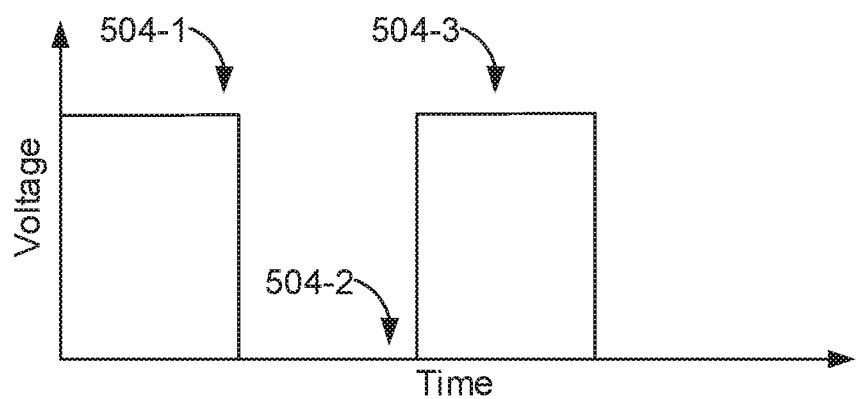
FIG. 5B is a diagram of a signal, according to one example of principles described herein.

FIG. 5B is a diagram of a signal, according to one example of principles described herein. As will be described below, a signal (504) is used to activate all actuators located on a first side (402-1) and second side (402-2) of a band (200).

As illustrated, the signal (504) is a square wave. When the signal (504) is high (504-1 and 504-3), the actuators located on a first side (402-1) and second side (402-2) of a band (200) are immediately activated. However, when the signal (504) is low (504-2), the actuators located on a first side (402-1) and second side (402-2) of the band (200) are immediately deactivated.

As a result, a unique pattern is created via the signal (504). In this example, the unique pattern is to solicit a response from the user. The response includes desiring the user to respond to an alarm.

Figure 5C:
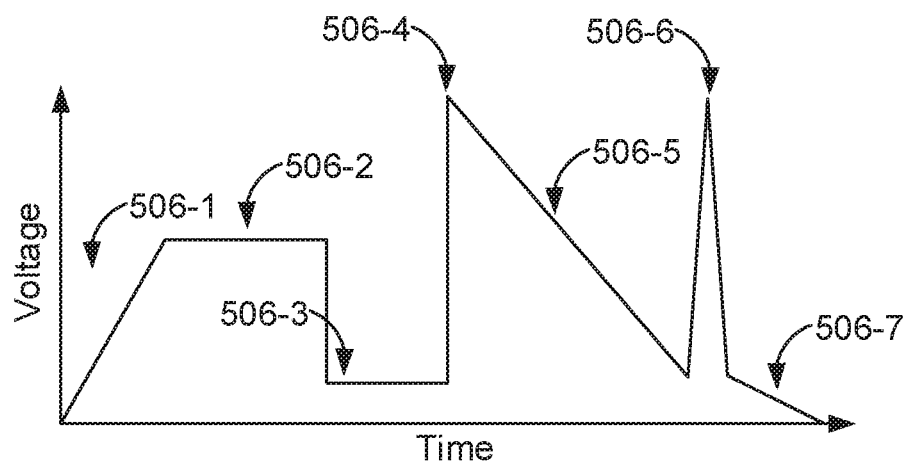
FIG. 5C is a diagram of a signal, according to one example of principles described herein.

FIG. 5C is a diagram of a signal, according to one example of principles described herein. As will be described below, a signal (506) is used to activate the actuators (100) located on a first side (402-1) a band (200). In this example, the signal (506) is a custom signal that is designed by the user.

As illustrated the signal (506) includes a first slope (506-1). The first slope (506-1) indicates the actuators (100) slow engages. The signal (506) includes a high portion (506-2). The high portion (506-2) indicates the actuators (100) remains engaged.

The signal (506) includes a low portion (506-3). The low portion (506-3) indicates the actuators (100) immediately disengage. The signal (506) includes a first peak (506-4). The first peak (506-4) indicates the actuators (100) immediately engage.

The signal (506) includes a second slope (506-5). The second slope (506-5) indicates the actuators (100) slowly disengage. The signal (506) includes a third peak (506-6). The third peak (506-6) indicates the actuators (100) quickly engages and then disengages. The signal (506) includes a third slope (506-7). The third slope (506-7) indicates the actuators (100) slowly disengage.

As a result, a unique pattern is created via the signal (506). In this example, the unique pattern is to alert a user about an incoming call from user B.

Figure 6:
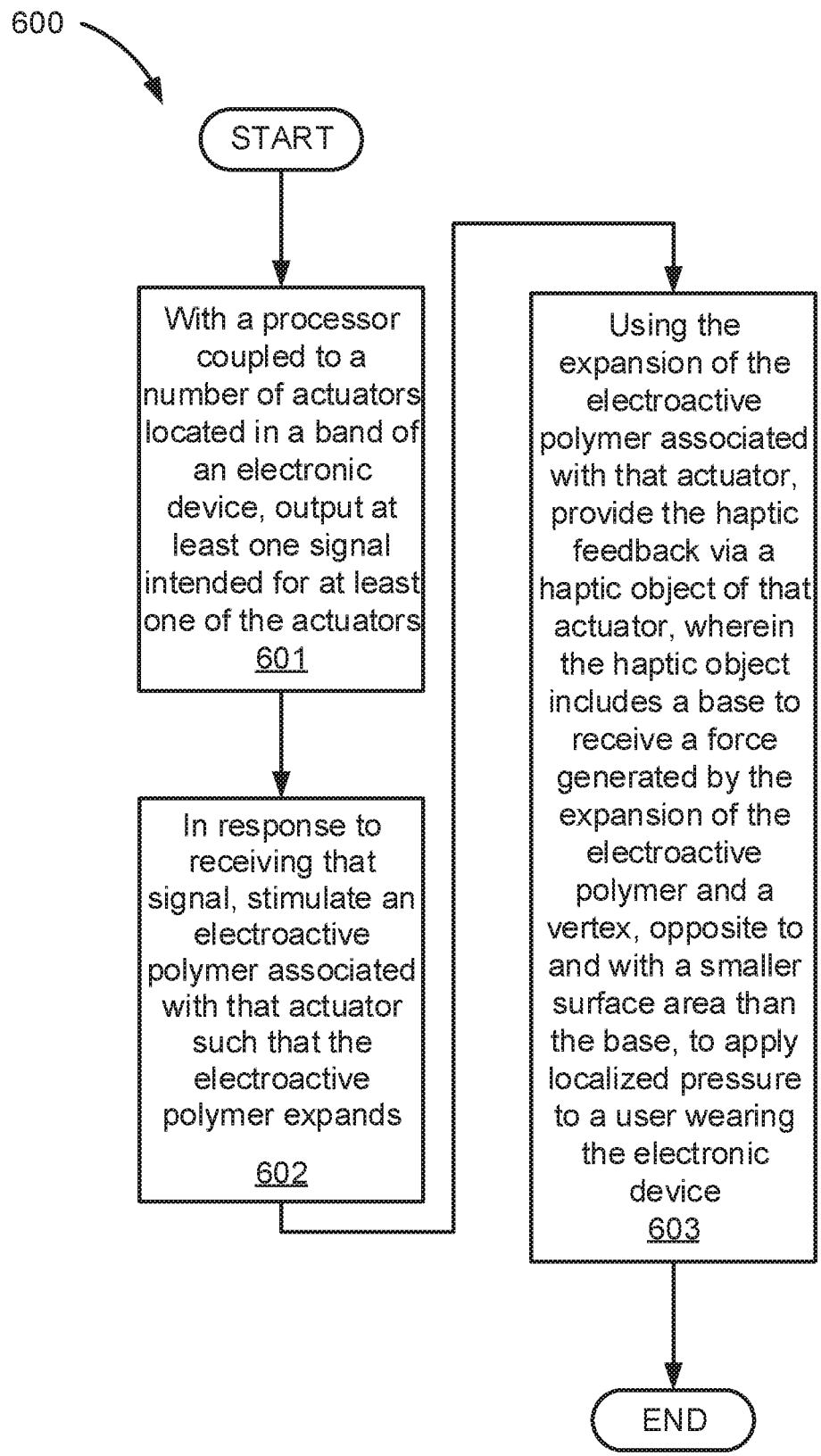
FIG. 6 is a flowchart of a method for providing haptic feedback, according to one example of principles described herein.

FIG. 6 is a flowchart of a method for providing haptic feedback, according to one example of principles described herein. The method (600) is executed by an actuator (100) of FIG. 1. The method (600) is executed by systems corresponding to FIG. 2 or FIG. 4. The method (600) includes with a processor coupled to a number of actuators located in a band of an electronic device, outputting (601) at least one signal intended for at least one of the actuators, in response to receiving that signal, stimulating (602) an electroactive polymer associated with that actuator such that the electroactive polymer expands and using the expansion of the electroactive polymer associated with that actuator, providing (603) the haptic feedback via a haptic object of that actuator, wherein the haptic object includes a base to receive a force generated by the expansion of the electroactive polymer and a vertex, opposite to and with a smaller surface area than the base, to apply localized pressure to a user wearing the electronic device.

As mentioned above, the method (600) includes with a processor coupled to a number of actuators located in a band of an electronic device, outputting (601) at least one signal intended for at least one of the actuators. In an example, the method (600) outputs one signal for one actuator. In another example, the method (600) outputs one signal for all the actuators. In yet another example, the method (600) outputs a different signal for each of the actuators.

As mentioned above, the method (600) includes in response to receiving that signal, stimulating (602) an electroactive polymer associated with that actuator such that the electroactive polymer expands. In an example, the signal varies in voltage with time. As a result, the electroactive polymer expands and contracts based on the signal. In another example, the signal does not vary in voltage with time. As a result, the electroactive polymer remains expanded during the duration of the signal.

As mentioned above, the method (600) includes using the expansion of the electroactive polymer associated with that actuator, providing (603) the haptic feedback via a haptic object of that actuator, wherein the haptic object includes a base to receive a force generated by the expansion of the electroactive polymer and a vertex, opposite to and with a smaller surface area than the base, to apply localized pressure to a user wearing the electronic device. In an example, the intensity of the haptic feedback depends on the signal.

In general, activating the actuators to create the haptic feedback involves applying a voltage to expand the electroactive polymer. However, complex signals involve alternating the signal and voltage of the signal so that the actuators are continually contracting and expanding for a duration of time to create the haptic feedback.

The construction and use of the haptic objects (102) of an actuator (100) allows the haptic feedback from any individual actuator to be highly localized, which allows greater granularity of feel and enables a larger number of actuators in the same area but maintaining haptic separation between adjacent actuators.

Figure 7:
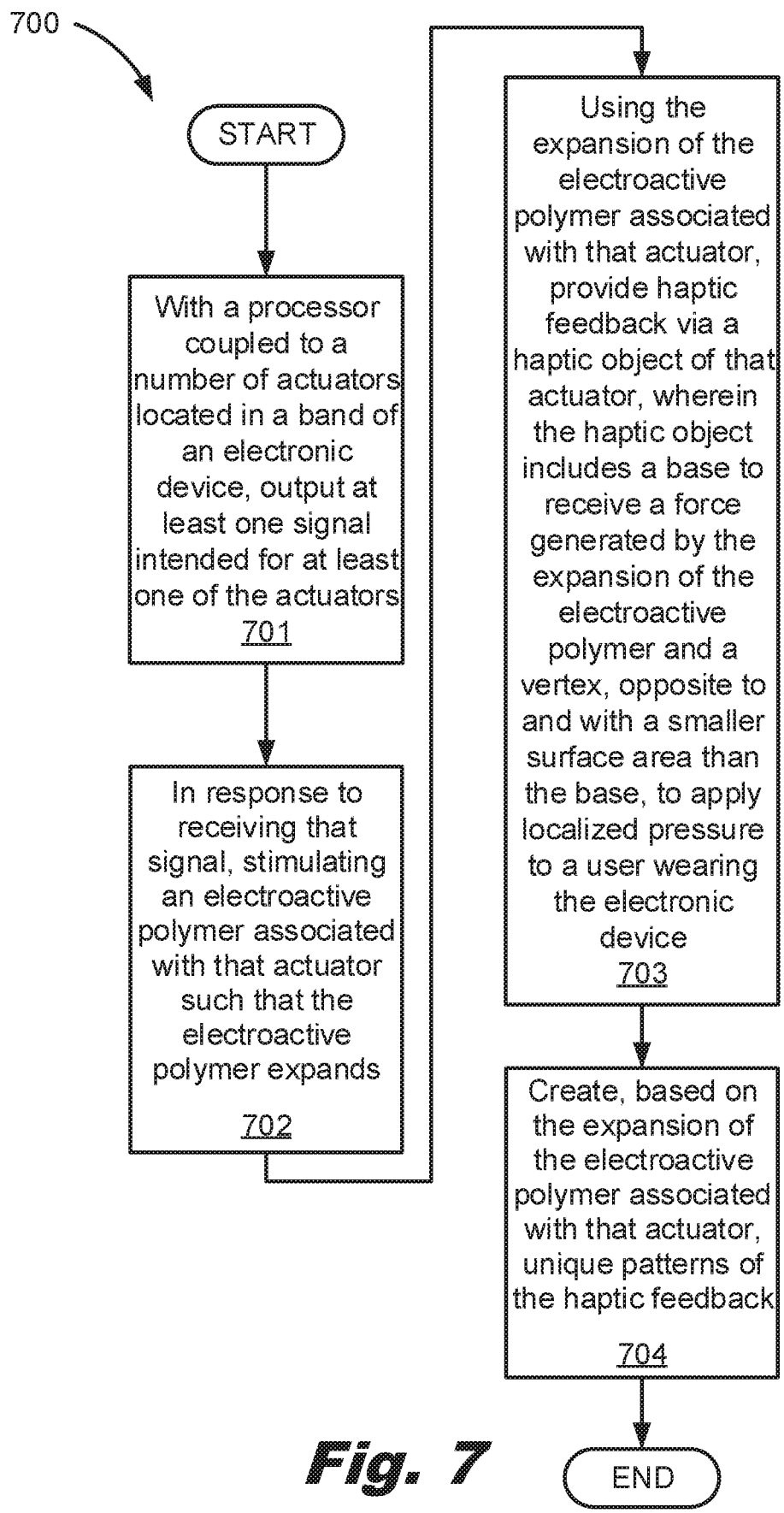
FIG. 7 is a flowchart of a method for providing haptic feedback, according to one example of principles described herein.

FIG. 7 is a flowchart of a method for providing haptic feedback, according to one example of principles described herein. The method (700) may be executed by an actuator (100) of FIG. 1. The method (700) may be executed by systems corresponding to FIG. 2 or FIG. 4. In this example, the method (700) includes with a processor coupled to a number of actuators located in a band of an electronic device, outputting (701) at least one signal intended for at least one of the actuators, in response to receiving that signal, stimulating (702) an electroactive polymer associated with that actuator such that the electroactive polymer expands, using the expansion of the electroactive polymer associated with that actuator, providing (703) the haptic feedback via a haptic object of that actuator, wherein the haptic object includes a base to receive a force generated by the expansion of the electroactive polymer and a vertex, opposite to and with a smaller surface area than the base, to apply localized pressure to a user wearing the electronic device and creating (704), based on the expansion of the electroactive polymer associated with that actuator, unique patterns of the haptic feedback.

As mentioned above, the method (700) includes creating (704), based on the expansion of the electroactive polymer associated with that actuator, unique patterns of the haptic feedback. The unique patterns of the haptic feedback allows for a broader and more diverse range of communication, which can be harnessed to increase either information density of haptic feedback, increase overtness of the haptic feedback, or increase clarity of haptic feedback. This lends itself to creating a more relevant and useful electronic device.

The unique patterns are based on a frequency of the signal. This includes how often the signal repeats itself in a given amount of time. For example, a signal that has a frequency of time X is considered to be unique from the same signal that has a frequency of time Y, if time X is greater than or less than time Y.

Further, unique patterns are based on an amount of a voltage associated with the signal. As mentioned above, the more voltage that is applied to the actuator, the more the actuator expands. This allows unique patterns to be created and differentiated from each other based on a voltage. For example, if a first actuator receives a signal that includes voltage X and a second actuator receives a signal that includes voltage Y, where voltage X and voltage Y are different voltages, the actuators create different haptic feedback. This is because the electroactive polymer for the first actuator and the second actuator are expanded or contracted to different positions. As a result, the haptic feedback is different.

The unique patterns are based on which of the actuators are activated. For example, a unique pattern activates the actuators (100) such that the user experiences a tapping sensation on one side of the wrist while experiencing a vibrating sensation on the other side of the wrist.

Further, unique patterns are based on a duration of the signal. This includes how long the signal lasts according to time. For example, a signal that has duration X is considered to be unique from a signal that has Y, if duration X is greater than or less than duration Y. This includes how to vary which of the actuators are activated over time to create more dynamic unique patterns.

The preceding description has been presented to illustrate and describe examples of the principles described. This description is not intended to be exhaustive or to limit these principles to any precise form disclosed. Many modifications and variations are possible in light of the above teaching.

What is claimed is:

1. A device for providing haptic feedback, the device comprising:
   a first electrode;
   a second electrode;
   an electroactive polymer located between the first electrode and the second electrode such that when a voltage is applied between the electrodes, the electroactive polymer expands creating a force; and
   a haptic object to apply the force to create the haptic feedback;
   wherein the haptic object comprises:
      a base to receive the force from the electroactive polymer; and
      a vertex, opposite to and with a smaller surface area than the base, to apply localized haptic feedback to a user.

2. The device of claim 1, wherein the electroactive polymer is a conducting polymer, a dielectric elastomer, a ferroelectric, an ionic polymer metal composite (IPMC), or a polyvinylidene difluoride (PVDF).

3. The device of claim 1, wherein the haptic object is made of a plastic such that the haptic object does not deform when force is applied to the haptic object.

4. The device of claim 1, further comprising a voltage source to apply a voltage to the electrodes between 0.5 volts (V) and 5 V.

5. The device of claim 1, wherein the first electrode and the second electrode are flexible such that, when the electroactive polymer expands, the first electrode and the second electrode flex.

6. The device of claim 1, further comprising a flexible film located between the haptic object and the first electrode, the flexible film providing a support for the haptic object.

7. A system for providing haptic feedback, the system comprising:
   a number of actuators disposed in a band of an electronic device, the actuators comprising:
      a number of first electrodes;
      a number of corresponding second electrodes, each pair of a first electrode and a second electrode being individually addressable;

an electroactive polymer located between the first electrodes and the second electrodes such that when a signal is transmitted to a pair of a first electrode and a second electrode, the electroactive polymer expands at an intersection of that first electrode and that second electrode creating a force;

a number of haptic objects located at each intersection of a first electrode and a second electrode, each of the haptic objects comprising:
  a base to receive the force generated by expansion of the electroactive polymer; and
  a vertex, opposite to and with a smaller surface area than the base, to apply localized pressure to a user wearing the electronic device;

a processor to independently control each of the actuators such that unique patterns of the haptic feedback are created within the band of the electronic device.

8. The system of claim 7, wherein the unique patterns are based on a frequency of the signal, an amount of a voltage associated with the signal, which of the actuators are activated, a duration of time, a desired response from the user, a waveform of the signal, or combinations thereof.

9. The system of claim 7, further comprising a flexible film located between the haptic objects and the first electrodes, the flexible film providing a support for the haptic objects.

10. The system of claim 7, wherein the electroactive polymer is conductive or field activated.

11. The system of claim 7, further comprising an overmolded material to encase the number of actuators to create the band of the electronic device.

12. The system of claim 11, wherein the overmolded material, corresponding to the interior of the band, comprises slots to accommodate the haptic objects.

13. The system of claim 11, wherein the overmolded material, corresponding to the interior of the band, has a lower durometer than the overmolded material corresponding to the exterior of the band.

14. A method for providing haptic feedback, the method comprising:
  with a processor coupled to a number of actuators located in a band of an electronic device, outputting at least one signal intended for at least one of the actuators;
  in response to receiving that signal, stimulating an electroactive polymer associated with that actuator such that the electroactive polymer expands; and
  using the expansion of the electroactive polymer associated with that actuator, providing the haptic feedback via a haptic object of that actuator;
  wherein the haptic object comprises:
    a base to receive a force generated by the expansion of the electroactive polymer; and
    a vertex, opposite to and with a smaller surface area than the base, to apply localized pressure to a user wearing the electronic device.

15. The method of claim 14, further comprising creating, based on the expansion of the electroactive polymer associated with that actuator, unique patterns of the haptic feedback.

* * * * *